US012624281B2

(12) United States Patent
Son et al.

(10) Patent No.: US 12,624,281 B2
(45) Date of Patent: May 12, 2026

(54) LIGHT-EMITTING MATERIAL, METHOD OF PREPARING THE SAME, AND LIGHT-EMITTING DEVICE INCLUDING THE LIGHT-EMITTING MATERIAL

(71) Applicant: Samsung Electronics Co., Ltd., Suwon-si (KR)

(72) Inventors: Daeyong Son, Cheonan-si (KR); YongChul Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 976 days.

(21) Appl. No.: 17/743,701

(22) Filed: May 13, 2022

(65) Prior Publication Data

US 2022/0380666 A1     Dec. 1, 2022

(30) Foreign Application Priority Data

May 14, 2021     (KR) ........................ 10-2021-0062945

(51) Int. Cl.
| | |
|---|---|
| *H01L 51/50* | (2006.01) |
| *C09K 11/06* | (2006.01) |
| *C09K 11/66* | (2006.01) |
| *H10K 50/115* | (2023.01) |
| *H10K 71/40* | (2023.01) |

(52) U.S. Cl.
CPC .............. *C09K 11/66* (2013.01); *C09K 11/06* (2013.01); *H10K 50/115* (2023.02); *H10K 71/441* (2023.02)

(58) Field of Classification Search
None
See application file for complete search history.

(56) References Cited

U.S. PATENT DOCUMENTS

2017/0133614 A1*     5/2017  Gu ........................ H10K 50/15
2017/0342316 A1     11/2017  Luther et al.
(Continued)

FOREIGN PATENT DOCUMENTS

| CN | 109659394 A | 4/2019 |
|---|---|---|
| KR | 20200132336 A | 11/2020 |
| WO | 2020233859 A1 | 11/2020 |

OTHER PUBLICATIONS

Tian et al., SCN-doped CsPbI3 for Improving Stability and Photodetection Performance of Colloidal Quantum Dots; Acta Phys.—Chim. Sin. 2021, 37 (4), 2007084 (1 of 7) (Year: 2021).*

(Continued)

*Primary Examiner* — Gregory D Clark
(74) *Attorney, Agent, or Firm* — CANTOR COLBURN LLP

(57) ABSTRACT

A light-emitting material, including: a quantum dot represented by Formula 1; and $Pb(SCN)_2$, wherein a surface of the quantum dot is passivated by the $Pb(SCN)_2$, and wherein the light-emitting material has a stretching vibrational peak corresponding to a carbon-nitrogen triple bond in a range of about 2000 inverse centimeter to about 2100 inverse centimeter, as measured by infrared (IR) spectroscopy:

$$A^1B^1X^1_3 \qquad \text{Formula 1}$$

wherein, in Formula 1, $A^1$ is at least one of a monovalent organic cation or a monovalent inorganic cation, $B^1$ is Sn or Pb, and $X^1$ is at least one halogen.

19 Claims, 11 Drawing Sheets

(56) References Cited

U.S. PATENT DOCUMENTS

| | | | |
|---|---|---|---|
| 2020/0385632 A1 | 12/2020 | Wong et al. | |
| 2020/0392402 A1 | 12/2020 | Lüchinger et al. | |

OTHER PUBLICATIONS

Lu et al, "Ammonium Tehiocyanate-Passivated CsPbI3 Provskite Nanocrystals for Efficient Red Light-Emitting Diodes", J. Phys. Chem. C. 2019, 123, 22787-22792.

Brent A. Koscher et al., "Essentially Trap-Free CsPbBr3 Colloidal Nanocrystals by Postsynthetic Thiocyanate Surface Treatment",J. Am. Chem. Soc. 2017, 139, 6566-6569.

Olivia J. Ashton et al., "A Phosphine Oxide Route to Formamidinium Lead Tribromide Nanoparticles," Chem. Mater. 2020, 32, 7172-7180.

Chao Zheng, et al., "SCN-doped CsPbI3 for Improving Stability and Photodetection Performance of Colloidal Quantum Dots", Supporting Information for Acta Phys.—Chim. Sin, Sep. 1, 2020.

Office Action issued Dec. 9, 2025 of KR Patent Application No. 10-2022-0057985.

* cited by examiner

COMPARATIVE     EXAMPLE 1     EXAMPLE 2     EXAMPLE 3     EXAMPLE 4
EXAMPLE 1

COMPARATIVE     EXAMPLE 1     EXAMPLE 2     EXAMPLE 3     EXAMPLE 4
EXAMPLE 1

LIGHT-EMITTING MATERIAL, METHOD OF PREPARING THE SAME, AND LIGHT-EMITTING DEVICE INCLUDING THE LIGHT-EMITTING MATERIAL

CROSS-REFERENCE TO RELATED APPLICATION

This application is based on and claims priority to Korean Patent Application No. 10-2021-0062945, filed on May 14, 2021 and Korean Patent Application No. 10-2022-0057985, filed on May 11, 2022, in the Korean Intellectual Property Office, and all benefits accruing under 35 U.S.C. § 119, the contents of which are incorporated by reference herein in their entireties.

BACKGROUND

1. Field

One or more aspects of the present disclosure relate to a light-emitting material, a light-emitting device including the same, and a method of manufacturing the light-emitting material.

2. Description of the Related Art

Light-emitting devices are devices that convert electrical energy into light energy.

Light-emitting devices commonly include an anode, a cathode, and an emission layer located between the anode and the cathode. Additionally, a hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

One or more aspects of the present disclosure include a light-emitting material, a light-emitting device including the same, and a method of preparing the light-emitting material. One or more aspects of the present disclosure include a light-emitting material with improved thermal stability and moisture stability, a light-emitting device including the same, and a method of preparing the light-emitting material.

Additional aspects will be set forth in part in the detailed description, which follows and, in part, will be apparent from the detailed description, or may be learned by practice of the presented one or more exemplary embodiments of the disclosure.

According to an aspect of the present disclosure, provided is a light-emitting material including a quantum dot represented by Formula 1, and $Pb(SCN)_2$, wherein a surface of the quantum dot is passivated by the $Pb(SCN)_2$, and wherein the light-emitting material has a stretching vibrational peak corresponding to a carbon-nitrogen triple bond in a range of about 2000 inverse centimeter ($cm^{-1}$) to about 2100 $cm^{-1}$, as measured by infrared (IR) spectroscopy:

$$A^1B^1X^1_3 \qquad \text{Formula 1}$$

wherein, in Formula 1, $A^1$ is at least one of a monovalent organic cation or a monovalent inorganic cation, $B^1$ is Sn or Pb, and $X^1$ is at least one halogen.

In one or more embodiments, $A^1$ is at least one of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation. In one or more embodiments, $A^1$ may be methylammonium (MA), formamidinium (FA), an alkali metal, or a combination thereof. In one or more embodiments, $A^1$ may be $Cs^+$, and $X^1$ may be $Cl^-$, $Br^-$, $I^-$, or a combination thereof.

For example, $A^1$ may be Cs+ and $X^1$ may be $Br^-$.

In one or more embodiments, the quantum dot represented by Formula 1 may include $CsPbBr_3$, $CsPbBr_xCl_{(3-x)}$ (wherein x is a real number greater than 0 and less than or equal to 3), $CsPbCl_3$, or a combination thereof.

For example, the quantum dot represented by Formula 1 may be $CsPbBr_3$.

In one or more embodiments, the quantum dot may be halogen-rich, as defined herein.

In one or more embodiments, the light emitting material may include about 0.1 millimoles (mmol) to about 2 mmol of $Pb(SCN)_2$ per 1 mmol of the quantum dot.

For example, the light emitting material may include about 0.1 mmol to about 1.6 mmol of $Pb(SCN)_2$ per 1 mmol of the quantum dot. For example, the light emitting material may include about 1 mmol or more of $Pb(SCN)_2$ per 1 mmol of the quantum dot.

For example, $Pb(SCN)_2$ may be included in a volume ratio of about 100 µl to about 800 µl per 1 mmol of the quantum dot.

For example, $Pb(SCN)_2$ may be included in a volume ratio of 390 µl or more per 1 mmol of the quantum dot.

In one or more embodiments, the light-emitting material may have an absorption peak present in the range of about 360 nanometer (nm) to about 410 nm in a ultraviolet-visible (UV-Vis) absorption spectrum.

In one or more embodiments, the light-emitting material may have an S 2p peak at a binding energy of about 160 electron volts (eV) to about 165 eV, when measured by X-ray photoelectron spectroscopy (XPS).

In one or more embodiments, the light-emitting material may have diffraction peaks corresponding to at least four crystal planes that are a (002) crystal plane, a (100) crystal plane, a (110) crystal plane, a (112) crystal plane, a (200) crystal plane, a (210) crystal plane, a (212) crystal plane, a (220) crystal plane, or a (310) crystal plane when determined by X-ray diffraction (XRD) analysis with Cu Kα radiation.

According to another aspect, provided is a light-emitting device including a first electrode, a second electrode facing the first electrode; and an emission layer located between the first electrode and the second electrode, wherein the emission layer includes the light-emitting material described herein.

In one or more embodiments, the light-emitting device may further include a hole transport region located between the first electrode and the emission layer, an electron transport region located between the emission layer and the second electrode, or both a hole transport region located between the first electrode and the emission layer, and an electron transport region located between the emission layer and the second electrode.

According to another aspect, provided is a method of preparing the light-emitting material, the method including: disposing a mixture including a quantum dot that is represented by Formula 1 and is halogen-rich, $Pb(SCN)_2$, and a solvent; and heating the substrate to remove the solvent and form the light-emitting material, wherein a surface of the quantum dot is passivated by the $Pb(SCN)_2$.

In one or more embodiments, the light emitting material may include about 0.1 millimoles (mmol) to about 2 mmol of $Pb(SCN)_2$ per 1 mmol of the quantum dot.

In an embodiment, $Pb(SCN)_2$ may be included in a volume ratio of about 100 µl to about 800 µl per 1 mmol of the quantum dot.

In one or more embodiments, the heating step may be performed at 30° C. or higher.

For example, the heating step may be performed at 50° C. or higher, the heating step may be performed at 80° C. or higher, the heating step may be performed at 100° C. or higher, the heating step may be performed at 120° C. or higher, or the heating step may be performed at 150° C. or higher.

In one or more embodiments, the solvent may be toluene, hexane, benzene, pentane, or a combination thereof.

In one or more embodiments, according to the method of preparing the light-emitting material, before the step of disposing the mixture, the steps of: forming a first mixed solution by mixing a first precursor solution and a second precursor solution, wherein the first precursor solution comprises a first precursor and a first solvent, and wherein the second precursor solution comprises a second precursor and a second solvent, forming a precipitate by mixing the first mixed solution with a third precursor solution wherein the third precursor solution includes a third precursor and a third solvent, separating the precipitate, and dispersing the precipitate in a fourth solvent, may be performed to form a halogen-rich quantum dot.

In one or more embodiments, the precipitate that is dispersed in the fourth solvent comprises a halogen-rich quantum dot and the first mixed solution may include a halogen-deficient quantum dot.

In one or more embodiments, the first precursor may be a salt of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation, and the second precursor and the third precursor may each independently be a salt of a halogen.

In one or more embodiments, the first solvent, the second solvent, and the third solvent may each independently be 1-octadecene (ODE), oleic acid (OA), oleylamine (OLA), or a combination thereof.

In one or more embodiments, the fourth solvent may be diethyl ether, toluene, α-terpineol, hexyl carbitol, ethyl acetate, butyl carbitol acetate, hexyl cellosolve, butyl cellosolve acetate, or a combination thereof.

BRIEF DESCRIPTION OF THE DRAWINGS

The above and other aspects, features, and advantages of certain exemplary embodiments of the disclosure will be more apparent from the following description taken in conjunction with the accompanying drawings, in which.

DETAILED DESCRIPTION

Figure 1:
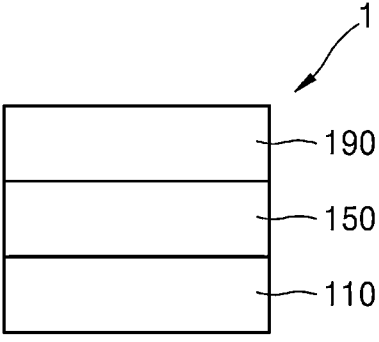
FIG. 1 is a schematic cross-sectional view of a light-emitting device according to one or more embodiments.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

The terminology used in the present specification is selected from general terms that are currently widely used while functions used in the present disclosure are taken into consideration. However, the terms may be changed according to, for example, the intention of a person skilled in the art or judicial precedents, or the appearance of new technologies. In addition, in certain cases, some terms are arbitrarily selected by the applicant, and in this case, their meanings will be described in detail in the detailed description of the present specification. Therefore, the terms used in the present specification should be defined based on the meanings thereof and the descriptions therefor provided throughout the present specification, not simply the names of the terms.

In the present specification, when an element "includes" a component, the element may further include other components unless defined otherwise.

Like reference numerals in the drawings refer to like components, and the size of each component in the drawings may be exaggerated or reduced for clarity and convenience of description.

When a portion of a layer, film, region, plate, etc. is said to be "on" another portion, this includes not only the case in which the portion is "directly on" another portion, but also the case in which an intervening layer is placed therebetween. When a portion is placed "directly on" the other portion, this means that there is no intervening layer.

In the present specification, the singular form includes the plural form unless defined otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

The term "Group" used herein refers to a group on the IUPAC Periodic Table of Elements.

The term "alkali metal" as used herein refers to a Group 1 element. Exemplary Group 1 elements include lithium (Li), sodium (Na), potassium (K), cesium (Cs), or the like.

The term "halogen" as used herein refers to a Group 17 element. Exemplary halogens include chlorine (Cl), bromine (Br), iodine (I), or the like.

The term "maximum emission wavelength" ($\lambda_{max}$) used herein refers to a wavelength value (nanometers (nm)) corresponding to a point having a maximum emission intensity in a photoluminescence (PL) spectrum of a solution or film sample including a compound.

The term "full width at half maximum (FWHM)" refers to the width of the wavelength at the point corresponding to half of the maximum emission intensity in the photoluminescence (PL) spectrum in nanometers (nm).

Hereinafter, a light-emitting material, a method of manufacturing the same, and a light-emitting device including the light-emitting material will be described in detail with reference to the accompanying drawings.

Light-Emitting Material

The light-emitting material includes a quantum dot represented by Formula 1; and $Pb(SCN)_2$, wherein a surface of the quantum dot is passivated by the $Pb(SCN)_2$, and wherein the light-emitting material has a stretching vibrational peak corresponding to a carbon-nitrogen triple bond present in a range of about 2000 inverse centimeter ($cm^{-1}$) to about 2100 $cm^{-1}$, when measured by infrared (IR) spectroscopy:

$$A^1B^1X^1_3 \qquad \text{Formula 1}$$

wherein, in Formula 1, $A^1$ is at least one of a monovalent organic cation or a monovalent inorganic cation, $B^1$ is Sn or Pb, and $X^1$ is at least one halogen.

In one or more embodiments, $A^1$ is at least one of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation. In one or more embodiments, $A^1$ may be methylammonium (MA), formamidinium (FA), an alkali metal, or a combination thereof. In one or more embodiments, $A^1$ may be $Cs^+$.

For example, in one or more embodiments, the quantum dot may be represented by Formula 1-A:

$$A^1PbX^1_3 \qquad \qquad \text{Formula 1-A}$$

wherein $A^1$ is at least one of a monovalent organic cation or a monovalent inorganic cation, and $X^1$ is at least one halogen.

Since the light-emitting material is passivated with $Pb(SCN)_2$, the thermal stability and moisture stability of the quantum dot represented by Formula 1 may be compensated for. Although not limited to a specific theory, it is expected that the thiocyanate (—SCN) group of the $Pb(SCN)_2$ may compensate for the deficiency of the X site of the quantum dot, replace the X site, and increase the bond strength. In addition, excess $Pb^{2+}$ may compensate for the deficiency of Pb in the lattice. Accordingly, since the light-emitting material may effectively passivate the deficiencies of $CsPbBr_3$, stability can be secured even at a high temperature, and the PL intensity may be maintained high even at a high temperature.

In one or more embodiments, regarding Formula 1, $A^1$ may be $Cs^+$, and $X^1$ may be $Cl^-$, $Br^-$, $I^-$, or a combination thereof. For example, regarding Formula 1, $A^1$ may be $Cs^+$ and $X^1$ may be $Br^-$.

In one or more embodiments, the quantum dot represented by Formula 1 may include $CsPbBr_3$, $CsPbBr_xCl_{(3-x)}$ (where x is a real number greater than 0 and less than or equal to 3), $CsPbCl_3$, or a combination thereof. For example, the quantum dot represented by Formula 1 may be $CsPbBr_3$.

In one or more embodiments, the quantum dot may be halogen-rich.

In one or more embodiments, the light emitting material may include about 0.1 millimoles (mmol) to about 2 mmol of $Pb(SCN)_2$ per 1 mmol of the quantum dot.

For example, the light emitting material may include about 0.1 mmol to about 1.6 mmol of $Pb(SCN)_2$ per 1 mmol of the quantum dot.

For example, the light emitting material may include about 1 mmol or more of $Pb(SCN)_2$ per 1 mmol of the quantum dot.

For example, the light emitting material may include about 0.04 mmol to about 0.6 mmol of $Pb(SCN)_2$ per 0.38 mmol of the quantum dot.

When the $Pb(SCN)_2$ is included in about 0.1 mmol to about 2 mmol per 1 mmol of the quantum dot, as the heat-treatment temperature increases, the PL quantum yield (PLQY) may be rather increased, and thus, improved characteristics may be exhibited at high temperature.

In one or more embodiments, the light-emitting material may have an absorption peak present in the range of about 360 nm to about 410 nm in a ultraviolet-visible (UV-Vis) absorption spectrum.

The term "Vis (visible)" used herein refers to light having the wavelength of about 390 nm to about 700 nm. The term "UV (ultraviolet)" used herein refers to light having the wavelength range which is equal to or greater than about 200 nm and less than about 390 nm.

Although not limited to a specific theory, in the UV-Vis absorption spectrum, an absorption peak existing in the range of about 360 nm to about 410 nm is considered to be a peak corresponding to sulfur (S).

In one or more embodiments, the light-emitting material may have an S 2p peak at a binding energy of about 160 electron volts (eV) to about 165 eV, when measured by X-ray photoelectron spectroscopy (XPS).

Although not limited to a specific theory, in the XPS spectrum, a peak at a binding energy of about 160 eV to about 165 eV is considered to be a peak corresponding to S.

In one or more embodiments, the light-emitting material may have diffraction peaks corresponding to at least four crystal planes that are a (002) crystal plane, a (100) crystal plane, a (110) crystal plane, a (112) crystal plane, a (200) crystal plane, a (210) crystal plane, a (212) crystal plane, a (220) crystal plane, or a (310) crystal plane, when determined by X-ray diffraction (XRD) analysis with Cu Kα radiation.

In one or more embodiments, quantum dot represented by Formula 1 may be of a platelet type or a cubic type.

For example, when the quantum dot is of a cubic type, the light-emitting material may have diffraction peaks corresponding to at least four crystal planes that are a (100) crystal plane, a (110) crystal plane, a (200) crystal plane, a (210) crystal plane, or a (220) crystal plane, when determined by X-ray diffraction (XRD) analysis with Cu Kα radiation.

For example, when the quantum dot is of a platelet type, the light-emitting material may have diffraction peaks corresponding to a (002) crystal plane, a (112) crystal plane, a (212) crystal plane, and a (310) crystal plane, when determined by X-ray diffraction (XRD) analysis with Cu Kα radiation.

The light-emitting material may emit green light.

The maximum emission wavelength ($\lambda_{max}$, nm) of the light-emitting material may be about 500 nm or more and about 550 nm or less, for example, from about 500 nm to about 530 nm.

The light-emitting material has relatively high stability even at high temperature.

Method of Manufacturing Light-Emitting Material

According to another aspect, provided is a method of preparing the light-emitting material, the method including: disposing a mixture including a quantum dot that is represented by Formula 1 and is halogen-rich, $Pb(SCN)_2$, and a solvent; and heating the substrate to remove the solvent and form the light-emitting material, wherein a surface of the quantum dot is passivated by the $Pb(SCN)_2$:

$$A^1B^1X^1_3 \qquad \qquad \text{Formula 1}$$

wherein, in Formula 1, $A^1$ is at least one of a monovalent organic cation or a monovalent inorganic cation, $B^1$ is Sn or Pb, and $X^1$ is at least one halogen.

Formula 1 may be understood with reference to the description provided above.

By using the halogen-rich quantum dot, compared to the halogen-deficient quantum dot, the surface deficiency of the quantum dot is relatively small. Accordingly, the surface of the quantum dot may be effectively passivated with limited $PbSCN_2$. Since $Pb(SCN)_2$ is present in the light-emitting material, the light-emitting material may have the above-described peaks of IR spectrum, UV-VIS spectrum, XPS spectrum, and XRD spectrum.

For a detailed description of the quantum dot, refer to the description provided above.

In one or more embodiments, the solvent may be toluene, hexane, benzene, pentane, or a combination thereof.

In one or more embodiments, the heating step (i.e., the heat treatment) may be performed at 30° C. or higher.

For example, the heating step may be performed at 50° C. or higher, the heating step may be performed at 80° C. or higher, the heating step may be performed at 100° C. or higher, the heating step may be performed at 120° C. or higher, or the heating step may be performed at 150° C. or higher.

In one or more embodiments, the heat treatment may be performed in the ambient atmosphere (i.e., in the air).

For example, the mixture may be spin coated onto a substrate. When the mixture is provided by spin coating, the spin coating condition may be selected in consideration of the composition of the mixture, and may include, for example, a coating speed of about 300 revolutions per minute (rpm) to about 4,000 rpm, a temperature range of about 80° C. to about 200° C. In one or more embodiments, the coating speed may be adjusted differently according to a section: for example, the coating speed may be maintained at about 300 rpm to about 700 rpm in a first section, and then, in a second section, at about 2,000 rpm to about 4,000 rpm.

In some embodiments, the mixture may be disposed onto the substrate by applying various other known methods.

For example, when the mixture is provided by spin coating, the mixture is first spin-coated on a substrate, and then an anti-solvent may be added dropwise thereto, sprayed, or the like while the substrate is continuously rotated.

Then, the solvent is removed by heat treatment (i.e., heating the substrate).

In one or more embodiments, the heating conditions may be determined in consideration of the composition of the first mixture and the second mixture, and may include the heating time of 15 minutes to 2 hours and the heating temperature of about 50° C. to about 100° C.

Method of Preparing Quantum Dots

The quantum dot represented by Formula 1 may be obtained according to the method of preparing quantum dot to be described herein.

In one or more embodiments, according to the method of preparing the light-emitting material, before the step of disposing the mixture on the substrate, the steps of: forming a first mixed solution by mixing a first precursor solution and a second precursor solution, wherein the first precursor solution comprises a first precursor and a first solvent, and wherein the second precursor solution comprises a second precursor and a second solvent, forming a precipitate by mixing the first mixed solution with a third precursor solution wherein the third precursor solution includes a third precursor and a third solvent, separating the precipitate, and dispersing the precipitate in a fourth solvent, may be performed to form a halogen-rich quantum dot, may be performed to form a halogen-rich quantum dot.

In one or more embodiments, the first solvent, the second solvent, and the third solvent may each independently be 1-octadecene (ODE), oleic acid (OA), oleylamine (OLA), or a combination thereof.

In this regard, the solubility of the first precursor with respect to the first solvent may be greater than the solubility of the first precursor with respect to the second solvent, and the solubility of the second precursor with respect to the second solvent may be greater than that of the second precursor with respect to the first solvent.

In one or more embodiments, the first solvent and the second solvent may be different from each other. In one or more embodiments, since the first solvent and the second solvent are different from each other, the solubilities of the first precursor with respect to the first solvent and the second solvent may be different from each other and the solubilities of the second precursor with respect to the first solvent and the second solvent may be different from each other.

For example, the first solvent may be a mixture of OA and ODE. For example, the second solvent may be a mixture of OA, OLA, and ODE.

In one or more embodiments, the first precursor may be soluble in the first solvent. In one or more embodiments, the first precursor may be dissolved in an amount of 1 gram (g) or more based on 100 g of the first solvent at a temperature of 25° C. and at the pressure of 1 atmosphere (atm). In one or more embodiments, the concentration of the first precursor solution may be 1 molar (M) or more at a temperature of 25° C. and at the pressure of 1 atm, or may be from about 1 M to about 10 M at a temperature of 25° C. and at the pressure of 1 atm.

In one or more embodiments, the second precursor may be soluble in the second solvent. In one or more embodiments, the second precursor may be dissolved in an amount of 1 g or more based on 100 g of the second solvent at a temperature of 25° C. and at the pressure of 1 atm. In one or more embodiments, the concentration of the second precursor solution may be 1 M or more at a temperature of 25° C. and at the pressure of 1 atm, 1 M or more at a temperature of 80° C. and at the pressure of 1 atm, and may be from about 1 M to about 2 M at a temperature of 80° C. and at the pressure of 1 atm.

In one or more embodiments, each of the first precursor solution and the second precursor solution may not include an acid. In general, in order to increase the solubility of a precursor for a quantum dot, an inorganic acid such as HBr or an organic acid such as oleic acid is used. However, according to the method of manufacturing the quantum dot as described above, even in the case where an acid is not included, a sufficiently high concentration of the first precursor may be dissolved in the first solvent, and a sufficiently high concentration of the second precursor may be dissolved in the second solvent.

In one or more embodiments, each of the first precursor solution and the second precursor solution may not include a base. According to the method of manufacturing the quantum dot, even in the case where a base is not included, a sufficiently high concentration of the first precursor may be dissolved in the first solvent and a sufficiently high concentration of the second precursor may be dissolved in the second solvent.

The third solvent may be identical to or different from each of the first solvent and the second solvent.

For example, the third solvent may be a mixture of OA and OLA.

In one or more embodiments, the first mixed solution may include a halogen-deficient quantum dot.

By adding the third precursor solution including the third precursor and the third solvent to the first mixed solution, the halogen-deficient quantum dot may be synthesized into a halogen-rich quantum dot. In one or more embodiments, the precipitate that is dispersed in the fourth solvent may include a halogen-rich quantum dot and the first mixed solution may include a halogen-deficient quantum dot.

The forming of the precipitate may be performed by adding dropwise the third precursor solution to the first mixed solution. In one or more embodiments, when the third precursor solution is added dropwise thereto while the first mixed solution is strongly stirred, the precipitate may be formed.

The forming of the precipitate may be performed below the boiling point of the first mixed solution. In one or more embodiments, the forming of the precipitate may be performed at about 20° C. to about 90° C., or at about 50° C. to about 80° C.

Furthermore, the additional step of adding a first compound to the precipitate dispersed in the fourth solvent before disposing the mixture on the substrate may be additionally performed to obtain a quantum dot.

In this regard, the fourth solvent and the first compound are different from each other, and for example, the solubility of the precipitate with respect to the fourth solvent and the solubility of the precipitate with respect to the first compound may be different from each other. Accordingly, when the first compound is added to the fourth solvent, the precipitate dissolved in the fourth solvent may be recrystallized in the form of quantum dots.

In one or more embodiments, the fourth solvent may be a good solvent capable of dissolving the precipitate well.

In one or more embodiments, the fourth solvent may be diethyl ether, toluene, α-terpineol, hexyl carbitol, ethyl acetate, butyl carbitol acetate, hexyl cellosolve, butyl cellosolve acetate, or a combination thereof.

In one or more embodiments, to substantially completely dissolve the precipitate in the fourth solvent, the precipitate may be heated to a temperature below the boiling point of the fourth solvent after the precipitate is separated and then dispersed in the fourth solvent.

In one or more embodiments, the first compound may be ethyl acetate (EA), dimethyl sulfoxide (DMSO), tetramethylene sulfoxide (TMSO), or diphenyl sulfoxide (DPSO).

In one or more embodiments, the first precursor may be a salt of methylammonium (MA), formamidinium (FA), and alkali metal, and the second precursor and the third precursor may each be a salt of a halogen.

In one or more embodiments, the first precursor may include a compound represented by Formula P1 or Formula P2:

$$A^1 X^1 \qquad \text{Formula P1}$$

In Formula P1, $A^1$ is at least one of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation. For example, $A^1$ may be methylammonium (MA), formamidinium (FA), alkali metal, or a combination thereof, and $X^1$ is at least one halogen.

$$A^2{}_2 X^2 \qquad \text{Formula P2}$$

In Formula P2, $A^2$ may be at least one of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation. For example, $A^2$ may be methylammonium (MA), formamidinium (FA), alkali metal, or a combination thereof, and $X^2$ may be at least one divalent anion.

For example, $X^2$ may be $CO_3{}^{2-}$ or $SO_4{}^{2-}$.

In one or more embodiments, the second precursor may include a compound represented by Formula P3:

$$B^3 X^3{}_2 \qquad \text{Formula P3}$$

In Formula P2, $B^3$ may be Pb or Sn, and $X^3$ may be at least one halogen.

For example, in Formulae P1 to P3, $A^1$ and $A^2$ may each be Cs+, $B^3$ may be Pb, and $X^1$ to $X^3$ may each independently be $Cl^-$, $Br^-$, or $I^-$.

In one or more embodiments, regarding Formulae P1 to P3, the case where $X^1$ or $X^2$ is $I^-$ and $X^3$ is $I^-$ is excluded. In the case where $X^1$ or $X^2$ is $I^-$, when $X^3$ is $I^-$, the stability of the formed quantum dot is low. Accordingly, the quantum dot may not be obtained at the target yield.

In one or more embodiments, the first precursor may include CsCl, CsBr, $Cs_2CO_3$ or a combination thereof.

In one or more embodiments, the second precursor may include $PbCl_2$, $PbBr_2$ or a combination thereof.

In one or more embodiments, the molar ratio of the first precursor to the second precursor may be 0.5:1 to 5.0:1. When the molar ratio is satisfied, a quantum dot having a target compositional formula may be obtained.

In one or more embodiments, the third precursor may include a compound represented by Formula P4:

$$C^4 X^4{}_2 \qquad \text{Formula P4}$$

Regarding Formula P4, $C^4$ may be a divalent metal cation, and $X^4$ may be a halogen.

For example, regarding Formula P4, $C^4$ may be $Zn^{2+}$, and $X^4$ may be $Cl^-$, $Br^-$, or $I^-$.

$X^3$ and $X^4$ in Formulae P3 and P4 may be identical to each other.

In one or more embodiments, the quantum dot may be poorly soluble, barely soluble, or insoluble in the first solvent, the second solvent, and the third solvent, so that a quantum dot may be obtained at an improved yield. In one or more embodiments, the quantum dot may be dissolved in the amount of 0.1 g or less based on 100 g of the first solvent at a temperature of 25° C. and at the pressure of 1 atm, the quantum dot may be dissolved in the amount of 0.1 g or less based on 100 g of the second solvent at a temperature of 25° C. and at the pressure of 1 atm, and the quantum dot may be dissolved in the amount of 0.1 g or less based on 100 g of the third solvent at a temperature of 25° C. and at the pressure of 1 atm.

In one or more embodiments, after separating the precipitate, washing may be further included before drying. In one or more embodiments, after separating the precipitate, washing using ethanol and/or diethyl ether may be further included. Due to the washing, the first precursor and/or the second precursor and/or the third precursor remaining in the precipitate may be removed, resulting in the increase in the purity of the finally obtained quantum dot.

In one or more embodiments, the drying may be performed at 40° C. to 80° C. In one or more embodiments, the drying may be performed at 60° C.

In one or more embodiments, the drying may be performed in a vacuum atmosphere.

In one or more embodiments, the drying may be performed for 10 hours or more. In one or more embodiments, the drying may be performed for 12 hours.

For example, the mixture may be spin coated onto a substrate. When the mixture is provided by spin coating, the spin coating condition may be selected in consideration of the composition of the mixture, and may include, for example, a coating speed of about 300 rpm to about 4,000 rpm, a temperature range of about 80° C. to about 200° C. The coating speed may be adjusted differently according to a section. In one or more embodiments, the coating speed may be maintained at about 300 rpm to about 700 rpm in the first section, and then, in the second section, at about 2000 rpm to about 4,000 rpm.

In some embodiments, the mixture may be disposed onto the substrate by applying various other known methods.

For example, when the mixture is provided by spin coating, the mixture is first spin-coated on a substrate, and then an anti-solvent may be added dropwise thereto, sprayed, or the like while the substrate is continuously rotated.

In one or more embodiments, the fourth solvent may be dimethyl formamide, dimethyl sulfoxide, γ-butyrolactone, N-methyl-2-pyrrolidone, or a combination thereof.

The fifth solvent may be diethyl ether, toluene, α-terpineol, hexyl carbitol, ethyl acetate, butyl carbitol acetate, hexyl cellosolve, butyl cellosolve acetate, or a combination thereof.

In one or more embodiments, the fourth solvent may be dimethyl sulfoxide, and the fifth solvent may be diethyl ether, toluene, ethyl acetate, or a combination thereof.

Then, the heating step is performed to remove the fourth solvent and the fifth solvent.

In one or more embodiments, the heating conditions may be determined in consideration of the composition of the first mixture and the second mixture, and may include the heat-treatment time of 15 minutes to 2 hours and the heat-treatment temperature of about 50° C. to about 100° C.

In one or more embodiments, the method of preparing the light-emitting material may further include heat treating the mixture including the light-emitting material and the fourth solvent. For the description of the fourth solvent and the heat treatment thereof, refer to the descriptions provided herein.

Light-Emitting Device

Reference will now be made to FIG. 1. According to one or more embodiments, provided is a light-emitting device 1 including a first electrode 110, a second electrode 190 facing the first electrode 110, and an emission layer 150 located between the first electrode 110 and the second electrode 190, wherein the emission layer 150 includes the light-emitting material as described herein.

The structure of the light-emitting device 1 will be described with reference to FIG. 1. FIG. 1 is a schematic cross-sectional view of the light-emitting device 1 according to one or more embodiments.

Although not illustrated in FIG. 1, a substrate may be additionally located under the first electrode 110 (away from the emission layer 150) and/or on the second electrode 190 (away from the emission layer 150). For use as the substrate, any substrate that is used in light-emitting devices of the related art may be used, and the substrate may be a glass substrate or a transparent plastic substrate, each having excellent mechanical strength, thermal stability, transparency, surface smoothness, ease of handling, and water resistance.

The first electrode 110 may be an anode to which a positive voltage is applied, and the second electrode 190 may be a cathode to which a negative voltage is applied. In one or more embodiments, the first electrode 110 may be a cathode, and the second electrode 190 may be an anode. For convenience, embodiments will be described assuming that the first electrode 110 is an anode and the second electrode 190 is a cathode.

The first electrode 110 may be formed by depositing or sputtering a material for forming the first electrode 110 on the substrate. The first electrode 110 may be a reflective electrode, a semi-transmissive electrode, or a transmissive electrode. In one or more embodiments, the first electrode 110 may be variously modified. For example, to obtain a bottom emission type light-emitting device, the first electrode 110 may be a semi-transmissive electrode or a transmissive electrode, and to obtain a top emission type light-emitting device, the first electrode 110 may be a reflective electrode. The first electrode 110 may have a single-layered structure or a multi-layered structure including two or more layers.

The material for forming the first electrode 110 may include materials with a high work function to facilitate the injection of holes. In one or more embodiments, the material for the first electrode may include indium tin oxide (ITO), indium zinc oxide (IZO), indium oxide, tin oxide ($SnO_2$), zinc oxide (ZnO), gallium oxide, or a combination thereof. In one or more embodiments, the material for forming the first electrode 110 may be magnesium (Mg), aluminum (Al), silver (Ag), aluminum-lithium (Al—Li), calcium (Ca), magnesium-indium (Mg—In), magnesium-silver (Mg—Ag), or a combination thereof.

The second electrode 190 facing the first electrode 110 may be provided. The second electrode 190 may be a reflective electrode, a semi-transmissive electrode, or a transmissive electrode. In one or more embodiments, the second electrode 190 may be variously modified. For example, to obtain a bottom emission type light-emitting device, the second electrode 190 may be a semi-transmissive electrode or a transmissive electrode, and to obtain a top emission type light-emitting device, the second electrode 190 may be a reflective electrode. The second electrode 190 may have a single-layered structure or a multi-layered structure including two or more layers.

The second electrode 190 may include metal, an alloy, an electrically conductive compound, or a combination thereof, each of which has a relatively low work function. In one or more embodiments, the material for the second electrode 190 may include lithium (Li), magnesium (Mg), aluminum (Al), silver (Ag), aluminum-lithium (Al—Li), calcium (Ca), gallium (Ga), magnesium-indium (Mg—In), magnesium-silver (Mg—Ag), or a combination thereof. These materials may be used to form the second electrode 150. In one or more embodiments, the material for the second electrode 150 may include ITO, IZO, or a combination thereof.

The emission layer 150 may include the light-emitting material described above. In the emission layer 150, electrons and holes transferred by the voltage supplied by the first electrode 110 and the second electrode 190 may be combined together. The electrons and holes are combined together to produce excitons, and then the excitons transition from the excited state to the ground state, thereby emitting light. The light-emitting device may have high color purity, high current efficiency and high quantum efficiency by including the light-emitting material described above.

For the light-emitting material, refer to the descriptions thereof provided above.

The light-emitting material may be present in a uniform concentration in the emission layer 150 or may have a constant concentration gradient in the emission layer 150.

When the light-emitting device 1 is a full color light-emitting device, the light-emitting device 1 may include an emission layer that emits light of different color for each subpixel.

In one or more embodiments, the emission layer may be patterned, for each subpixel, as a first color emission layer, a second color emission layer, and a third color emission layer. In this regard, at least one emission layer from among the above-described emission layers may necessarily include the light-emitting material. In one or more embodiments, the first color emission layer may be an emission layer that includes the quantum dot, and the second color emission layer and the third color emission layer may be organic emission layers that include different organic compounds. In this regard, the first color through the third color are different colors, and for example, the first color through the third color may have different maximum emission wavelengths. The first color through the third color may be white when combined with each other.

In one or more embodiments, the emission layer may further include a fourth color emission layer, and at least one emission layer from among the first color emission layer through the fourth color emission layer may be an emission layer including the light-emitting material, and the other emission layers may be organic emission layers that include different organic compounds. In this regard, the first color through the fourth color are different colors, and for example, the first color through the fourth color may have different maximum emission wavelengths. The first color through the fourth color may be white when combined with each other.

In one or more embodiments, the light-emitting device may have a stacked structure in which two or more emission layers emitting light of different colors contact each other or are separated from each other. Other various modifications can be made. For example, at least one emission layer of the two or more emission layers is an emission layer including the quantum dot, and the remaining emission layer is an organic emission layer including an organic compound.

The emission layer 150 may further include, in addition to the light-emitting material, one or more of an organic compound, other inorganic compounds, organic-inorganic complex compounds, or a quantum dot, but is not limited thereto.

The emission layer 150 may have a thickness of about 10 nm to about 200 nm, for example, about 50 nm to about 100 nm. When the thickness of the emission layer 150 is within the range, excellent luminescence characteristics may be obtained without a substantial increase in driving voltage.

An auxiliary layer may be further included between the first electrode 110 and the emission layer 150 and/or between the second electrode 190 and the emission layer 150 to improve device characteristics such as luminescence efficiency by adjusting the charge carrier balance inside a device. For example, a hole transport region may be further included between the first electrode 110 and the emission layer 150, and an electron transport region may be further included between the second electrode 190 and the emission layer 150.

In one or more embodiments, the hole transport region may inject and/or transport holes from the first electrode 110 to the emission layer 150. Additionally, the hole transport region may compensate for an optical resonance distance according to a wavelength of light emitted from the emission layer, and thus, efficiency of a formed organic light-emitting device may be improved.

The hole transport region may include at least one of a hole injection layer, a hole transport layer, or a charge control layer. The hole transport region may have a single-layered structure or a multi-layered structure including two or more layers. In detail, the hole transport region may include only either a hole injection layer or a hole transport layer. In one or more embodiments, the hole transport region may have a hole injection layer/hole transport layer structure or a hole injection layer/hole transport layer/charge control layer structure, which are sequentially stacked in this stated order from the first electrode 110.

The hole transport region may include, for example, 1,3-bis(9-carbazolyl)benzene (mCP), 4,4'-bis(N-carbazolyl)-1,1'-biphenyl (CBP), 3,3-bis(carbazol-9-yl)biphenyl (mCBP), 4,4',4''-tris[phenyl(m-tolyl)amino]triphenylamine (m-MTDATA), TDATA, 2-TNATA, N,N'-di(1-naphthyl)-N, N'-diphenyl-(1,1'-biphenyl)-4,4'-diamine (NPB), β-NPB, N,N'-bis(3-methylphenyl)-N,N'-diphenylbenzidine (TPD), spiro-TPD, spiro-NPB, methylated-NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), tris(4-carbazoyl-9-ylphenyl)amine (TCTA), polyaniline/dodecylbenzenesulfonic acid (Pani/DBSA), poly(3,4-ethylenedioxythiophene)/poly(4-styrenesulfonate) (PEDOT/PSS), poly(9,9-dioctyl-fluorene-co-N-(4-butylphenyl)-diphenylamine) (TFB) poly(aryl amine), poly (N-vinylcarbazole) (PVK), polypyrrole, polyaniline/camphor sulfonic acid (Pani/CSA), (polyaniline)/poly(4-styrenesulfonate) (PANI/PSS), a combination thereof, or the like. However, embodiments of the present disclosure are not limited thereto:

m-MTDATA

TDATA

17

-continued

2-TNATA

NPB

β-NPB

TPD

18

-continued

Spiro-TPD

Spiro-NPB methylated NPB

TAPC

HMTPD

The thickness of the hole transport region may be determined in consideration of the wavelength of light emitted from an emission layer, and the driving voltage and current efficiency of a light-emitting device. In one or more embodiments, the thickness of the hole transport region may be from about 10 nm to about 1,000 nm, for example, about 10 nm to about 100 nm. When the hole transport region includes a hole injection layer and a hole transport layer, the thickness of the hole injection layer may be about from 10 nm to about 200 nm, and the thickness of the hole transport layer may be from about 5 nm to about 100 nm.

The hole transport region may further include, in addition to these materials, a p-dopant for the improvement of conductive properties. The p-dopant may be homogeneously or non-homogeneously dispersed in the hole transport region.

The p-dopant may be one of a quinone derivative, a metal oxide, or a cyano group-containing compound, but embodiments of the present disclosure are not limited thereto. Examples of the p-dopant are a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; or a cyano group-containing compound, such as dipyrazino[2,3-f:2',3'-h]quinoxaline-2,3,6,7,10,11-hexacarbonitrile (HAT-CN), but are not limited thereto.

The electron transport region may inject and/or transport electrons from the second electrode 190 to the emission layer 150. Additionally, the electron transport region may compensate for an optical resonance distance according to a wavelength of light emitted from the emission layer, and thus, efficiency of a formed organic light-emitting device may be improved.

The electron transport region may include at least one of an electron injection layer, an electron transport layer, or a charge control layer. The electron transport region may have a single-layered structure or a multi-layered structure including two or more layers. In detail, the electron transport region may include only either an electron injection layer or an electron transport layer. In one or more embodiments, the hole transport region may have an electron transport layer/electron injection layer structure or a charge control layer/electron transport layer/electron injection layer structure, wherein, in each structure, constituting layers are sequentially stacked from the emission layer 150.

The electron transport region may include, for example, at least one of tris(8-hydroxyquinolinato)aluminum ($Alq_3$), 2,9-dimethyl-4,7-diphenyl-1,10-phenanthroline (BCP), 4,7-diphenyl-1,10-phenanthroline (BPhen), bis(2-methyl-8-quinolinolato-N1,O8)-(1,1'-biphenyl-4-olato)aluminum) (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ) bis(10-hydroxybenzo[h]quinolinato)beryllium ($Bebq_2$), B3PYMPM, 1,3,5-tri(1-phenyl-1H-benzo[d]imidazol-2-yl)phenyl (TPBI), 3TPYMB, BmPyPB, TmPyPB, BSFM, PO-T2T, PO15, or a combination thereof, but embodiments of the present disclosure are not limited thereto. In one or more embodiments, the electron transport layer and/or charge control layer may include at least one of the compounds as described above, but embodiments of the present disclosure are not limited thereto.

B3PYMPM

TPBI

3TPYMB

BmPyPB

-continued

TmPyPB

BSFM

PO-T2T

PO15

In one or more embodiments, the electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or a combination thereof. In one or more embodiments, the electron injection layer may further include the organic material as described above.

In one or more embodiments, the electron injection layer may consist of LiF, NaF, CsF, KF, Li$_2$O, Cs$_2$O, K$_2$O, BaO, SrO, CaO, 8-quinolinolato lithium (LiQ), or a combination thereof, or may further include the organic compound as described above, but embodiments of the present disclosure are not limited thereto.

The thickness of the electron transport region may be determined in consideration of the wavelength of light emitted from an emission layer, and the driving voltage and current efficiency of a light-emitting device. In one or more embodiments, the thickness of the electron transport region may be from about 1 nm to about 1,000 nm, for example, about 1 nm to about 200 nm. When the electron transport region includes an electron injection layer and an electron transport layer, the thickness of the electron injection layer may be about from 1 nm to about 50 nm, and the thickness of the electron transport layer may be from about 5 nm to about 100 nm.

The charge control layer may be included to adjust the charge injection balance at the interface between a layer containing an organic compound (for example, a hole transport layer, an electron transport layer, or the like) and a layer containing an inorganic compound (for example, an emission layer). The charge control layer may include a polymer compound, for example, poly(methyl methacrylate) (PMMA), poly(imide) (PI), poly(vinyl alcohol) (PVA), a combination thereof, or a copolymer thereof, but embodiments of the present disclosure are not limited thereto. Due to the inclusion of the electron control layer, the charge injection balance of the light-emitting device is improved, and thus, the external quantum efficiency may be increased. In addition, by placing the electron control layer to be directly adjacent to the emission layer, the emission layer may be formed flat and the driving voltage of the light-emitting device may be lowered.

In one or more embodiments, the light-emitting device may further include a hole transport region located between the first electrode and the emission layer and/or an electron transport region located between the emission layer and the second electrode.

In one or more embodiments, a charge control layer may be included between the first electrode and the emission layer and/or between the emission layer and the second electrode.

Each layer of the light-emitting device 1 may be formed using various methods such as a vacuum deposition method, a spin coating method, a casting method, or a LB method.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about 10$^{-8}$ torr to about 10$^{-3}$ torr, and a deposition rate of about 0.01 angstrom per second (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Hereinbefore, the light-emitting device 10 according to one or more embodiments has been described in connection with FIG. 1, but embodiments of the present disclosure are not limited thereto.

Hereinafter, with reference to Synthesis Examples and Examples, a method of preparing the light-emitting material and a light-emitting material prepared by using the method, and a light-emitting device including the light-emitting material will be described in further detail. However, the present disclosure is not limited to these synthesis example and examples. The wording "'B' was used instead of 'A'" used in describing Synthesis Examples means that an amount of 'A' used was identical to an amount of 'B' used, in terms of a molar equivalent.

EXAMPLES

Analysis Method
(1) PL Spectrum Measurement

A quantum dot was formed on a glass substrate and a film having the thickness of 5 μm to 20 μm was manufactured. The film was excited with excitation light having a wavelength of 365 nm, 400 nm, or 450 nm and the PL spectrum thereof was measured at room temperature (ca. 23-25° C.) by using an ISC PC1 spectrofluorometer.
(2) PLQY Measurement A quantum dot was formed on a glass substrate and a film having the thickness of 5 μm to 20 μm was manufactured. The film was excited by excitation light having the wavelength of 450 nm by using C9920-02 and PMA-11 of Hamamatsu photonics Inc. to measure PLQY thereof.
(3) UV-Vis Spectroscopic Analysis UV spectroscopic analysis was performed using an Agilent Cary5000 spectrometer to obtain UV-Visible absorption spectrum.
(4) XPS Analysis X-ray photoelectron spectroscopy (XPS) analysis was performed using Quantum 2000 (Physical Electronics. Inc.) (acceleration voltage of 0.5 kiloelectron volts (keV) to 15 keV, 300 watts (W), energy resolution of about 1.0 eV, a minimum analysis area of 10 micrometers, and a sputter rate of 0.1 nanometer per minute (nm/min).
(5) X-Ray Diffraction (XRD) Analysis The XRD measurement was measured using CuKα radiation as a target beam, and in order to improve peak intensity resolution, a monochromator device was removed, and the measurement conditions were as follows: 2θ was from 10° to 50°, a scan speed (°/S) was from 0.044 to 0.089, and a step size (°/step) was from 0.013 to 0.039.
(6) IR Spectrum Measurement A quantum dot was formed on a glass substrate and a film having the thickness of 5 μm to 20 μm was manufactured. Regarding the film, a Bruker Vertex 70 spectrometer was used and the wavenumber ($cm^{-1}$) measured herein was from 500 $cm^{-1}$ to 4,000 $cm^{-1}$.

Synthesis Example 1: Fabrication of Quantum Dot 1

A first precursor solution was prepared by dissolving 3 g (9.2 mmol) of $Cs_2CO_3$ as a first precursor in 12 milliliters (mL) of OA and 32 mL of ODE (at a volume ratio of 3:8) at about 140° C. Separately, 0.7 g (1.9 mmol) of $PbBr_2$ and 1.1 g of $ZnBr_2$, which were used as second precursors, were dissolved in OA, OLA, and ODE (at a volume ratio of 7:7:40) at 160° C. to prepare a stirred solution. The first precursor solution was heated to 100° C., and the second precursor solution was heated to 170° C.

0.3 mL of the first precursor solution was added dropwise to the second precursor solution at a temperature of at 170° C. while stirring, and after about 8 seconds, the reaction was quenched with cold water (ca. 0° C.). Then, the obtained precipitate mixture was centrifuged at 8,000 rpm to separate the precipitate and the solution, and the precipitate was dispersed in 5 mL of toluene. A precipitate was generated by using 10 mL of methyl acetate (or ethyl acetate) in the dispersed solution, and the precipitate and the solution were separated by centrifugation at 8,000 rpm, and then the precipitate was redispersed in 5 mL of toluene.

Synthesis Example 2: Preparation of Quantum Dot 2

A first precursor solution was prepared by dissolving 3 g (9.2 mmol) of $Cs_2CO_3$ as a first precursor in 12 mL of OA and 32 mL of ODE (the volume ratio of 3:8) at about 140° C. Separately, 0.7 g (1.9 mmol) of $PbBr_2$, which was used as a second precursor, was dissolved in OA, OLA, and ODE (the volume ratio of 7:7:40) at 160° C. to prepare a stirred solution. The first precursor solution was heated to 100° C., and the second precursor solution was heated to 170° C.

0.3 mL of the first precursor solution was added dropwise to the second precursor solution at a temperature of at 170° C. while stirring, and after about 8 seconds, the reaction was quenched with cold water (ca. 0° C.). Then, the obtained precipitate mixture was centrifuged at 8,000 rpm to separate the precipitate and the solution, and the precipitate was dispersed in 5 mL of toluene. A precipitate was generated by using 10 mL of methyl acetate (or ethyl acetate) in the dispersed solution, and the precipitate and the solution were separated by centrifugation at 8,000 rpm, and then the precipitate was redispersed in 5 mL of toluene.

Example 1: Preparation of Light-Emitting Material 3 mmol of $Pb(SCN)_2$ was added in 1 mL of DMF. 50 μL of $Pb(SCN)_2$-added DMF was added to the solution containing 5 mL (0.38 mmol) of quantum dot 1, and stirred for about 10 minutes. The resulting mixture was centrifuged at 8,000 rpm to separate a precipitate and a solution, and then the precipitate was discarded and the solution was used. After drop-casting the obtained mixture, a light-emitting film was manufactured at room temperature in the atmosphere.

Figure 2A:
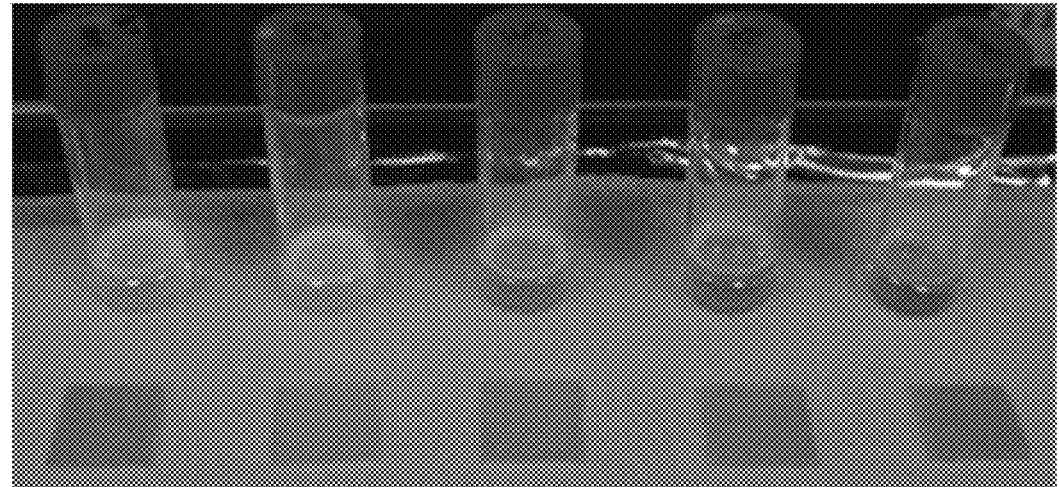
FIG. 2A is a photographic image of the light-emitting materials prepared according to Comparative Example 1 and Example 1 to Example 4, at room temperature and in ambient air.
Figure 2B:
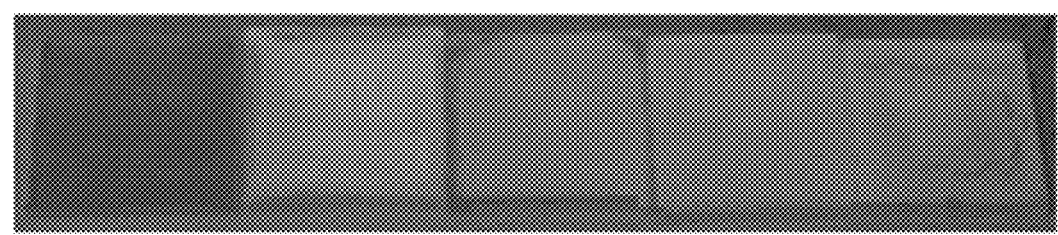
FIG. 2B is a photographic image of the quantum dots according to Comparative Example 1 and Examples 1 to 4, at room temperature and in ambient air.

Photographic images of the obtained light-emitting material at room temperature and in indoor atmosphere are shown in FIGS. 2A and 2B.

Example 2: Preparation of Light-Emitting Material

A light-emitting material was synthesized in a similar manner as in Example 1, except that the amount of $Pb(SCN)_2$-added DMF was changed to 100 μL.

Photographic images of the obtained light-emitting material at room temperature and in indoor atmosphere are shown in FIGS. 2A and 2B.

Example 3: Preparation of Light-Emitting Material

A light-emitting material was synthesized in a similar manner as in Example 1, except that the amount of $Pb(SCN)_2$-added DMF was changed to 150 μL.

Photographic images of the obtained light-emitting material at room temperature and in indoor atmosphere are shown in FIGS. 2A and 2B.

Example 4: Preparation of Light-Emitting Material

A light-emitting material was synthesized in a similar manner as in Example 1, except that the amount of Pb(SCN)₂-added DMF was changed to 200 μL.

Photographic images of the obtained light-emitting material at room temperature and in indoor atmosphere are shown in FIGS. 2A and 2B.

Comparative Example 1: Preparation of Light-Emitting Material

Quantum dot 1 obtained in Synthesis Example 1 was used as a light-emitting material.

Photographic images of the light-emitting material at room temperature and in indoor atmosphere are shown in FIGS. 2A and 2B.

Comparative Example 2: Preparation of Light-Emitting Material

Pb(SCN)₂ was used as the light-emitting material.

Comparative Example 3: Preparation of Light-Emitting Material

Quantum dot 2 obtained in Synthesis Example 2 was used as a light-emitting material.

Comparative Example 4: Preparation of Light-Emitting Material

50 μL of Pb(SCN)₂-added DMF was added to 5 mL (0.38 mmol) of quantum dot 2, and then stirred. After drop-casting

Comparative Example 7: Preparation of Light-Emitting Material 3 mmol of phenylammonium bromide (PEABr) was added in 1 mL of DMF. 100 μL of PEABr-added DMF was added to 5 mL (0.38 mmol) of quantum dot 1, and then stirred. After drop-casting the resulting mixture, a heat treatment was performed at room temperature in the atmosphere to synthesize a light-emitting material.

Comparative Example 8: Preparation of Light-Emitting Material

A light-emitting material was synthesized in the same manner as in Comparative Example 7, except that the amount of PEABr-added DMF was changed to 200 μL.

Comparative Example 9: Preparation of Light-Emitting Material

A light-emitting material was synthesized in the same manner as in Comparative Example 7, except that the amount of PEABr-added DMF was changed to 300 μL.

Evaluation Example 1: Measurement of PLQY

Figure 3A:
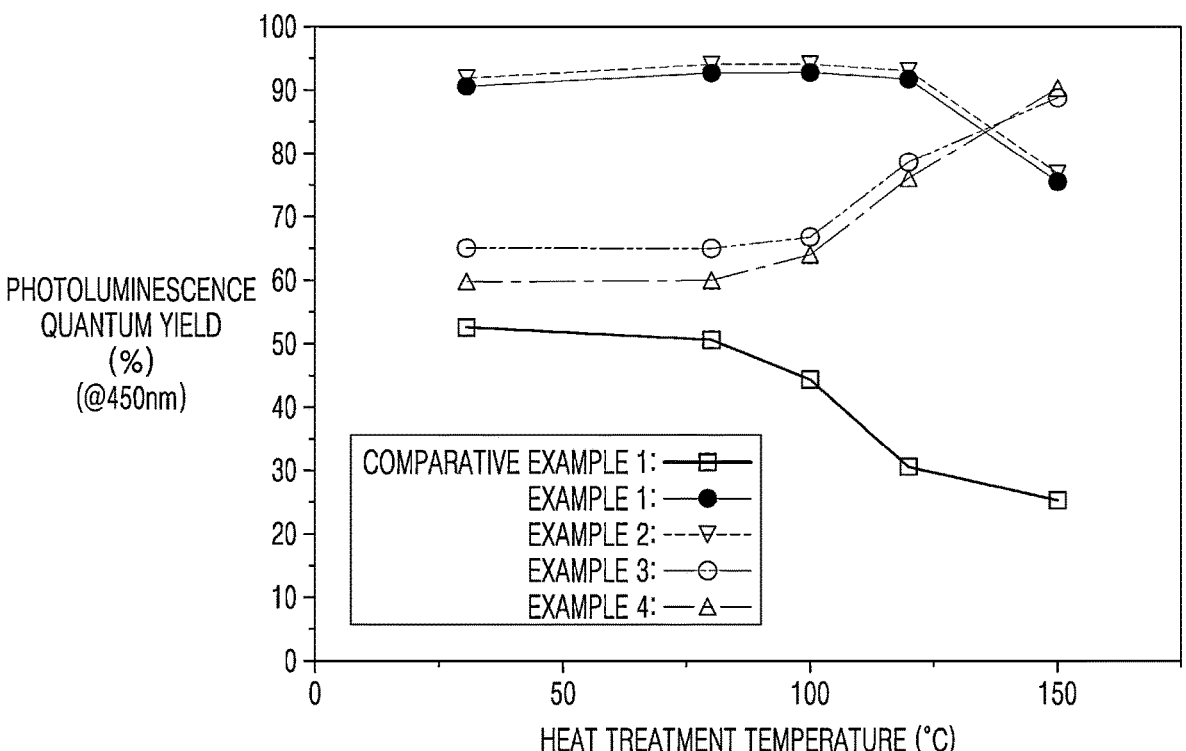
FIG. 3A is a graph of photoluminescence quantum yield (%, as determined at 450 nanometers (nm)) versus heat treatment temperature (° C.), showing the change in the photoluminescence quantum yield according to the heat treatment of the light-emitting materials according to Comparative Example 1 and Examples 1 to 4.

The PL maximum emission wavelength ($\lambda_{max}$, nm), FWHM (nm), and PLQY (%) of the light-emitting materials prepared in Comparative Example 1 and Examples 1 to 4 were measured at both 170° C. and 210° C., and are shown in FIG. 3A and Table 1.

TABLE 1

| Heat-treatment temperature 210° C. | PL $\lambda_{max}$ (nm) | FWHM (nm) | PLQY (%) | Heat-treatment temperature 170° C. | PL Peak (nm) | FWHM (nm) | PLQY (%) |
|---|---|---|---|---|---|---|---|
| Comparative Example 1. | 505 | 19 | 100 | Comparative Example 1. | 506 | 20 | 78 |
| Example 1 | 504 | 19 | 100 | Example 1 | 504 | 21 | 93 |
| Example 2 | 505 | 19 | 95 | Example 2 | 504 | 21 | 98 |
| Example 3 | 506 | 19 | 100 | Example 3 | 506 | 21 | 90 |
| Example 4 | 505 | 20 | 100 | Example 4 | 505 | 21 | 92 | the resulting mixture, a heat treatment was performed at 150° C. in the atmosphere to synthesize a light-emitting material.

Comparative Example 5: Preparation of Light-Emitting Material

A light-emitting material was synthesized in a similar manner as in Comparative Example 4, except that the amount of Pb(SCN)₂-added DMF was changed to 100 μL.

Comparative Example 6: Preparation of Light-Emitting Material

A light-emitting material was synthesized in a similar manner as in Comparative Example 4, except that the amount of Pb(SCN)₂-added DMF was changed to 150 μL.

Referring to FIG. 3A and Table 1, it can be seen that Examples 1 to 4 have a relatively high PLQY compared to Comparative Example 1 even after the heat treatment.

Referring to FIG. 3A, in the case of Examples 3 and 4 in which the amount of Pb(SCN)₂ is high, PLQY was rather increased as the heat-treatment temperature was increased, and at a temperature of 150° C., Examples 3 and 4 had higher PLQY than Example 1 and Example 2.

Figure 3B:
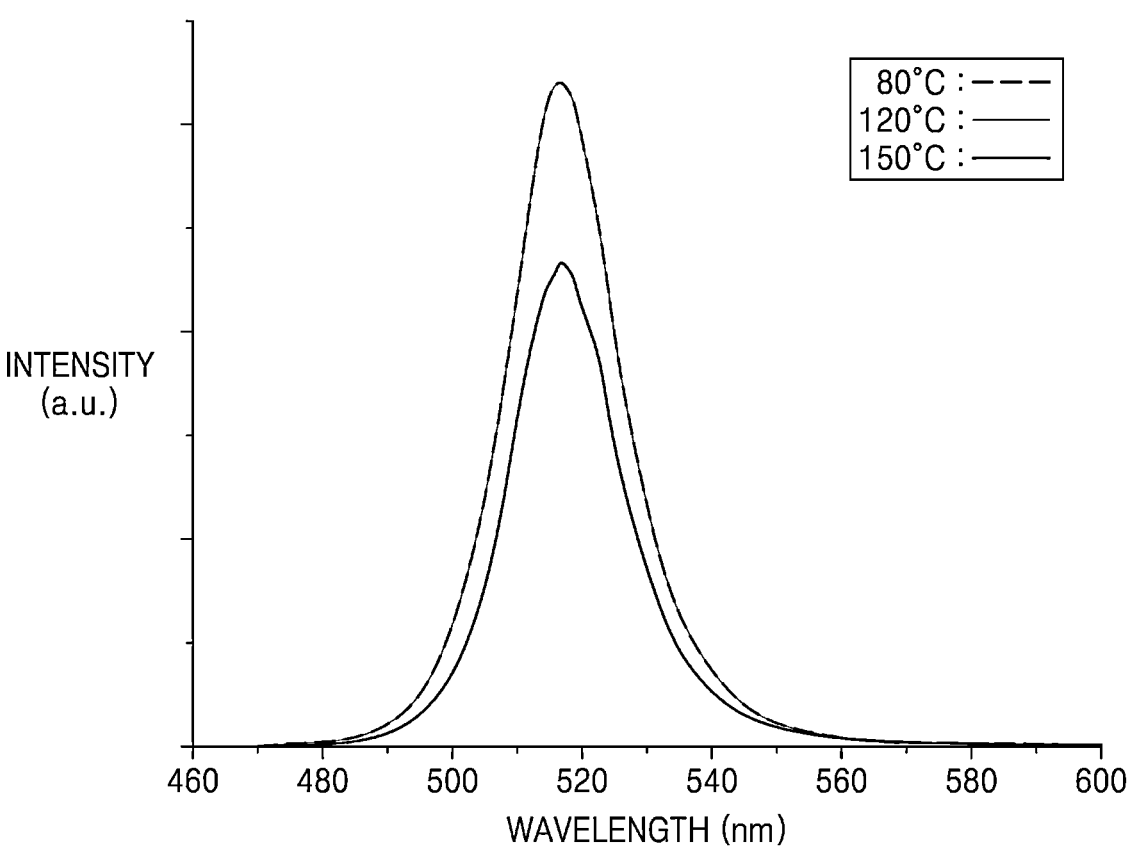
FIG. 3B is a graph of intensity (arbitrary units, a.u.) versus wavelength (nm), showing the change in the intensity of emission peak according to the heat treatment temperature of the light-emitting material according to Example 2.
Figure 3C:
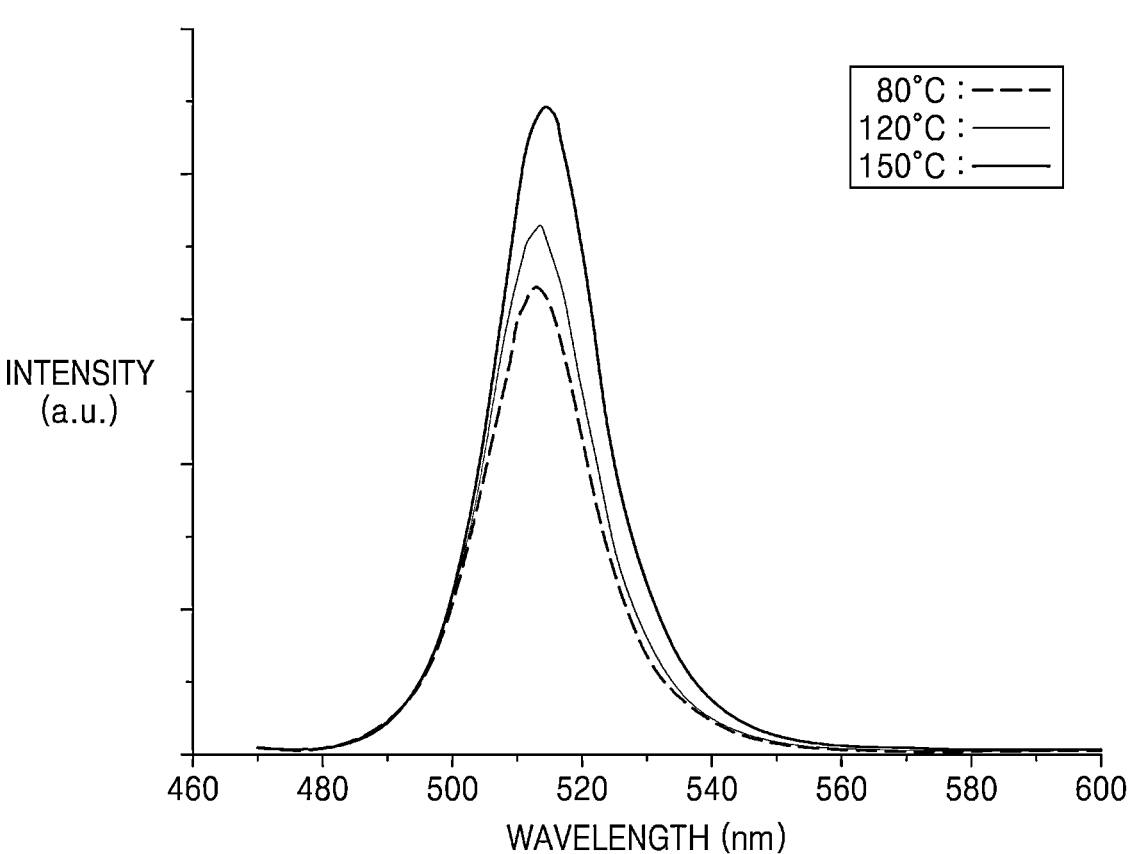
FIG. 3C is a graph of intensity (a.u.) versus wavelength (nm), showing the change in the intensity of emission peak according to the heat treatment temperature of the light-emitting material according to Example 4.

FIG. 3B is a graph showing the change in the intensity of emission peak according to the heat treatment temperature of the light-emitting material according to Example 2, and FIG. 3C is a graph showing the change in the intensity of emission peak according to the heat treatment temperature of the light-emitting material according to Example 4.

Referring to FIGS. 3B and 3C together with FIG. 3A, in the case of Examples 3 and 4 in which the amount of $Pb(SCN)_2$ is high, it can be seen that the PL peak intensity and PLQY were rather increased as the heat-treatment temperature was increased.

Evaluation Example 2: UV-VIS Spectra and PL Peak Measurement

Figure 4A:
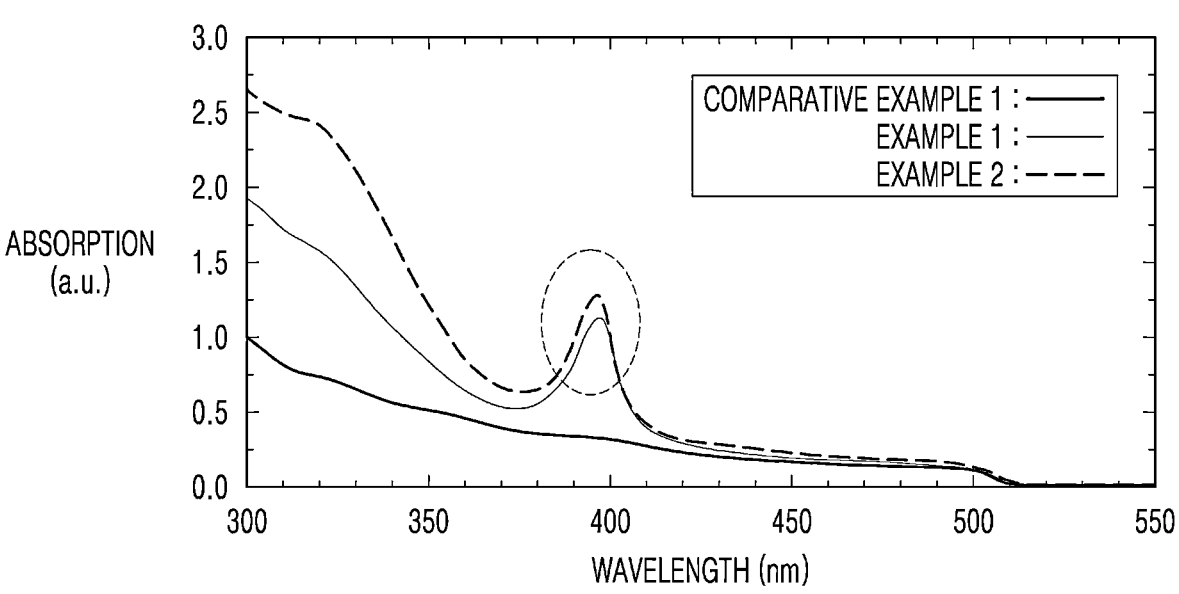
FIG. 4A is a graph of intensity (a.u.) versus wavelength (nm), showing ultraviolet-visible (UV-Vis) absorption spectra of the light-emitting materials according to Comparative Example 1 and Examples 1 2.
Figure 4B:
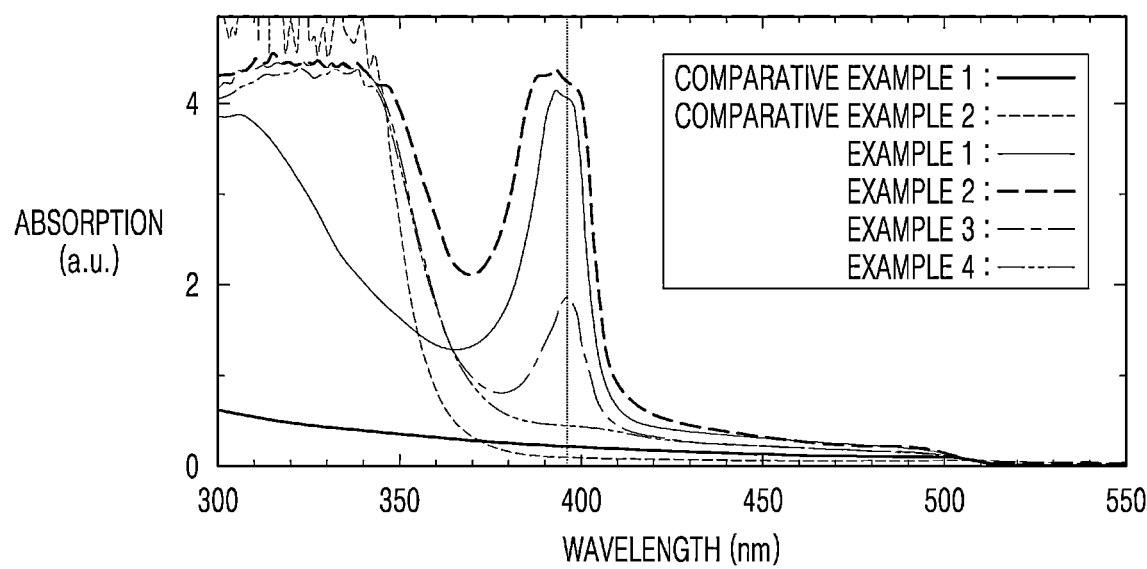
FIG. 4B is a graph of intensity (a.u.) versus wavelength (nm), showing UV-Vis absorption spectra of the light-emitting materials according to Comparative Examples 1 and 2 and Examples 1 to 4.
Figure 4C:
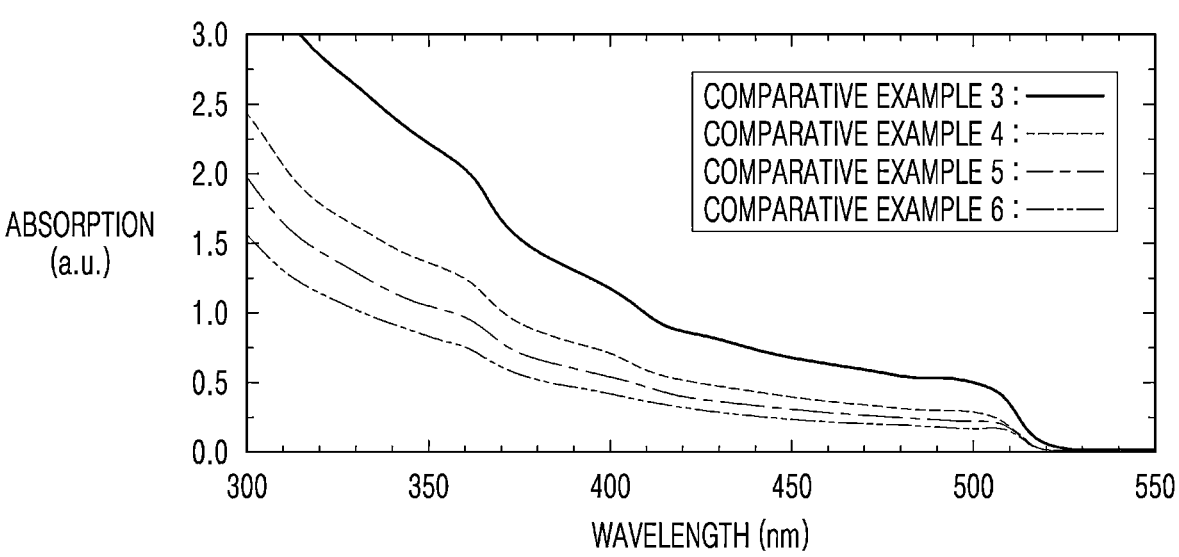
FIG. 4C is a graph of intensity (a.u.) versus wavelength (nm), showing UV-Vis absorption spectra of the light-emitting materials according to Comparative Examples 3 to 6.
Figure 4D:
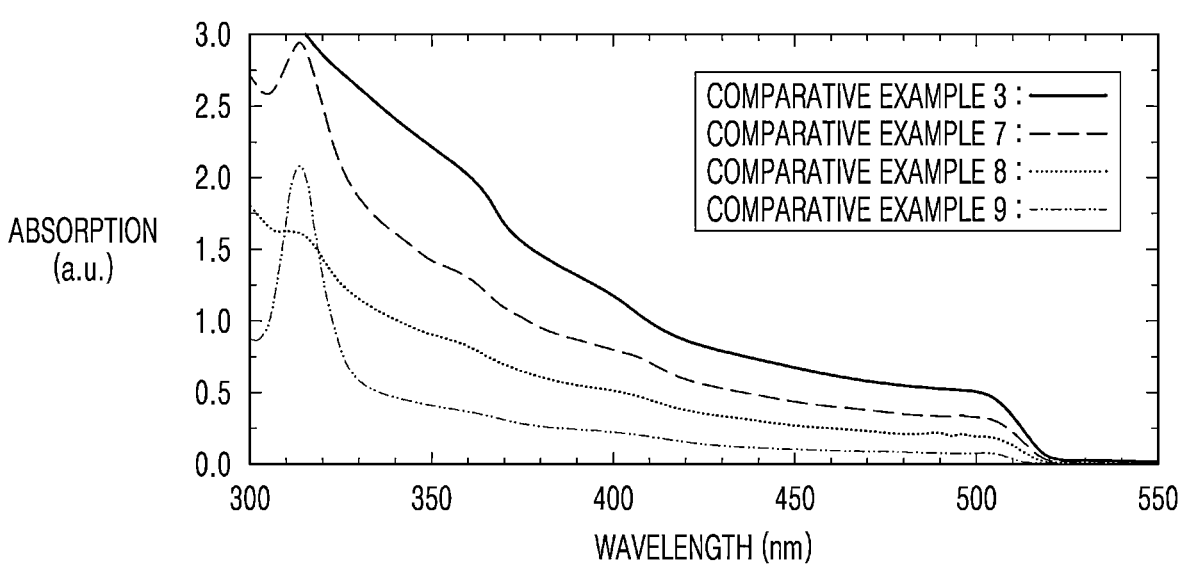
FIG. 4D is a graph of intensity (a.u.) versus wavelength (nm), showing UV-Vis absorption spectra of the light-emitting materials according to Comparative Example 3 and Comparative Examples 7 to 9.
Figure 5:
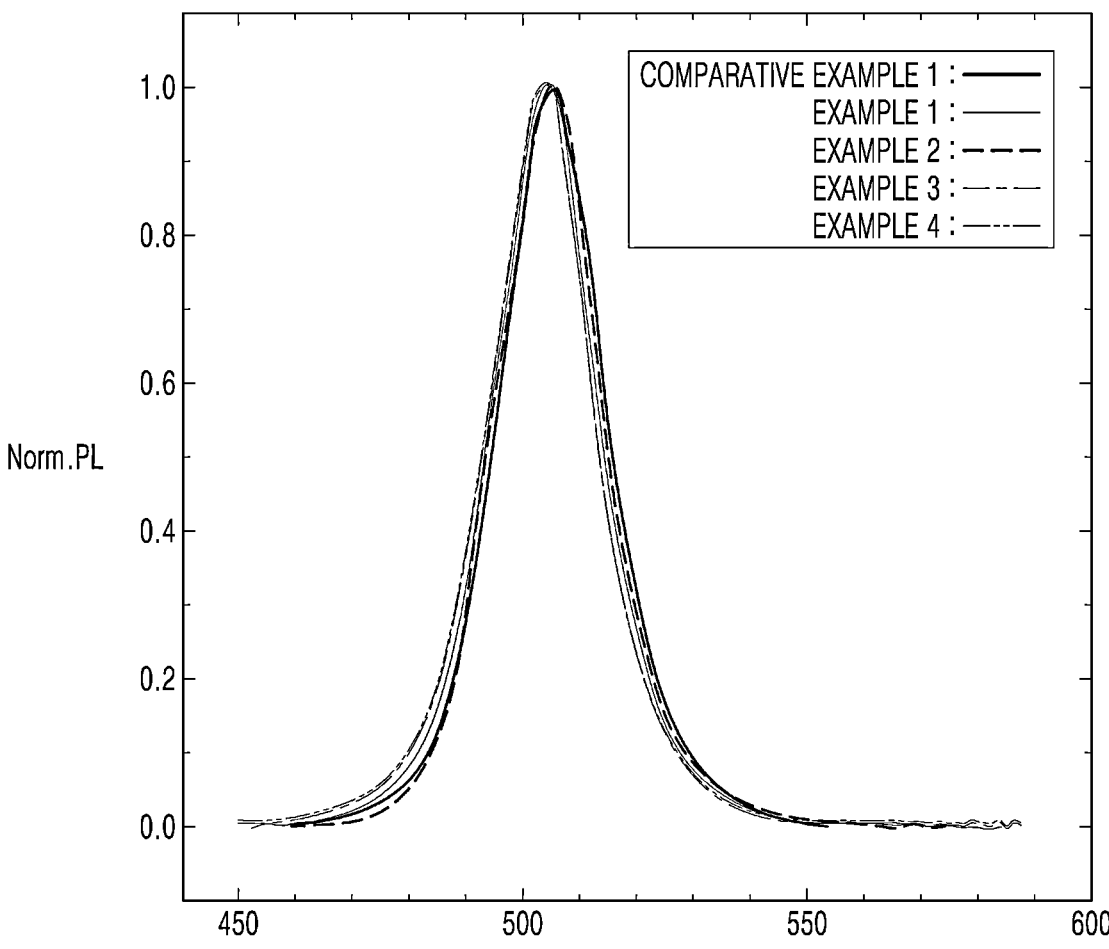
FIG. 5 is a graph of normalized PL intensity (a.u.) versus wavelength (nm), showing room temperature photoluminescence (PL) spectra of the light-emitting materials according to Comparative Example 1 and Examples 1 to 4.

UV-VIS spectra of the light-emitting materials according to Examples 1 to 4 and Comparative Examples 1 to 9 were measured and results thereof are shown in FIGS. 4A to 4D, and PL peak spectra of the light-emitting materials according to Examples 1 to 4 and Comparative Example 1 were measured and results thereof are shown in FIG. 5.

FIG. 4A shows UV-Vis absorption spectra of the light-emitting materials according to Comparative Example 1 and Example 1 and Example 2, FIG. 4B shows UV-Vis absorption spectra of the light-emitting materials according to Comparative Example 1 and Comparative Example 2 and Example 1 to Example 4, FIG. 4C shows UV-Vis absorption spectra of the light-emitting materials according to Comparative Example 3 to Comparative Example 6, and FIG. 4D shows UV-Vis absorption spectra of the light-emitting materials according to Comparative Example 3 and Comparative Examples 7 to Comparative Example 9.

Referring to FIGS. 4A and 4B, in the case of Comparative Example 1 that does not include $Pb(SCN)_2$, when compared with Examples 1 to 4, an absorption peak was not formed near the wavelength of 400 nm. Accordingly, it can be seen that the quantum dot was not passivated with $Pb(SCN)_2$. In addition, in the case of Comparative Example 2 in which only $Pb(SCN)_2$ was included, an absorption peak near the wavelength of 400 nm was not formed, which indicates that the quantum dot was not passivated with $Pb(SCN)_2$.

On the other hand, referring to FIGS. 4B and 4C, in the case of Comparative Example 3 in which $Pb(SCN)_2$ was not included, and Comparative Examples 4 to 6 in which the quantum dot lacks Br although including $Pb(SCN)_2$, an absorption peak near the wavelength of 400 nm was not formed. Accordingly, it can be seen that the peak caused by $Pb(SCN)_2$ may appear only in the quantum dot that is rich with Br.

On the other hand, referring to FIGS. 4B and 4D, it can be seen that in the case of Comparative Examples 7 to 9 in which PEABr, which is a Br-containing material, was included and $Pb(SCN)_2$ was not included, an absorption peak near the wavelength of 400 nm was not formed, which indicates the quantum dot was not passivated with Pb(SCN)₂.

Also, referring to FIGS. 4B and 5 together, the light-emitting materials of Examples 1 to 4 passivated with $Pb(SCN)_2$ not only exhibited good PLQY, but also shows a PL peak intensity that is not smaller than that of the light-emitting material of Comparative Example 1.

Evaluation Example 3: FT-IR Spectra Measurement

Figure 6:
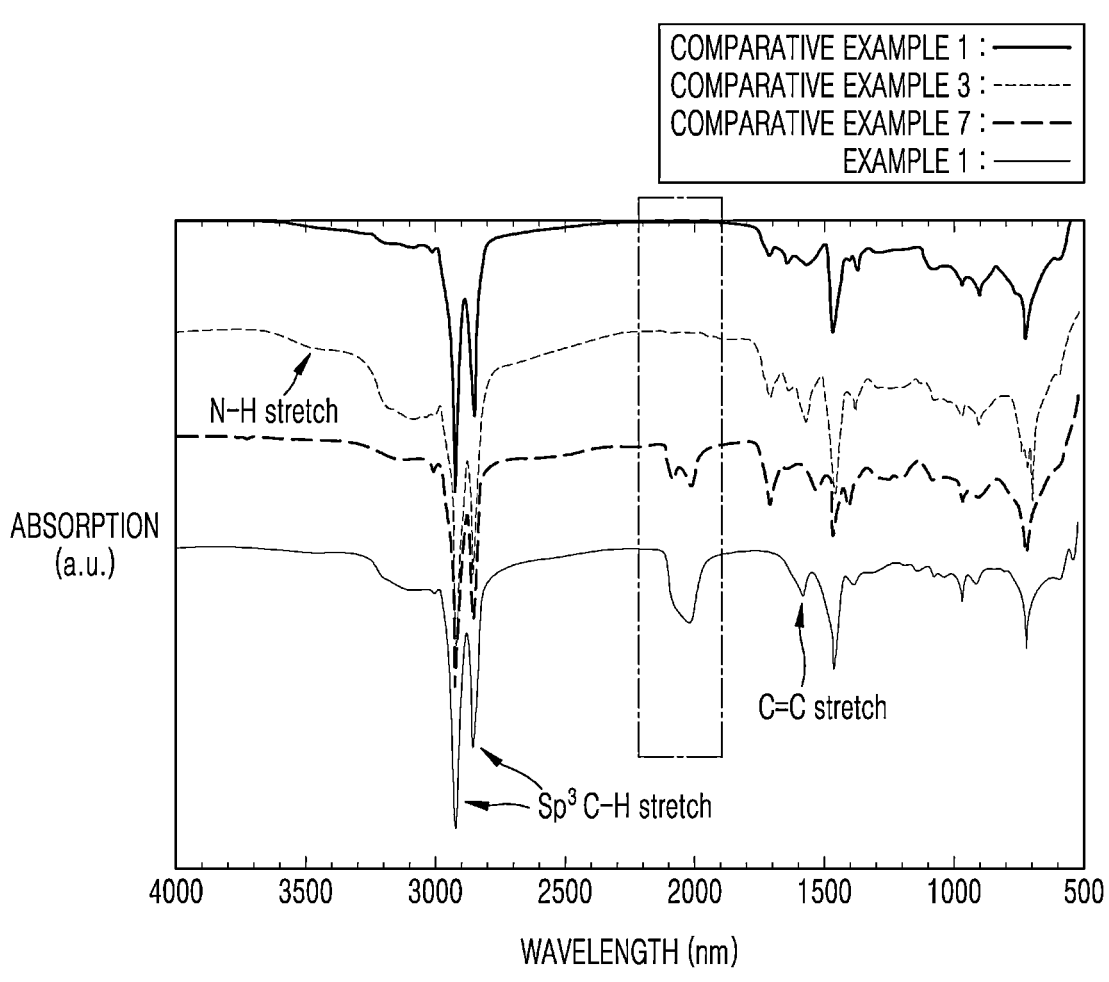
FIG. 6 is a graph of intensity (a.u.) versus wavelength (nm), showing Fourier-transform infrared spectroscopy (FT-IR) spectra of the light-emitting materials according to Example 1, Comparative Example 1, Comparative Example 3, and Comparative Example 7.

When the heat-treatment temperature was 120° C., FT-IR spectra of the light-emitting materials according to Example 1, Comparative Example 1, Comparative Example 3, and Comparative Example 7 were measured, and results thereof are shown in FIG. 6.

Referring to FIG. 6, it can be seen that, in the case of Example 1, due to the $Pb(SCN)_2$ treatment, a carbon-nitrogen triple bond stretching IR absorption peak near a specific wavelength (2,000 $cm^{-1}$ to 2,100 $cm^{-1}$) was formed.

Evaluation Example 4: XPS Spectrum Measurement

Figure 7:
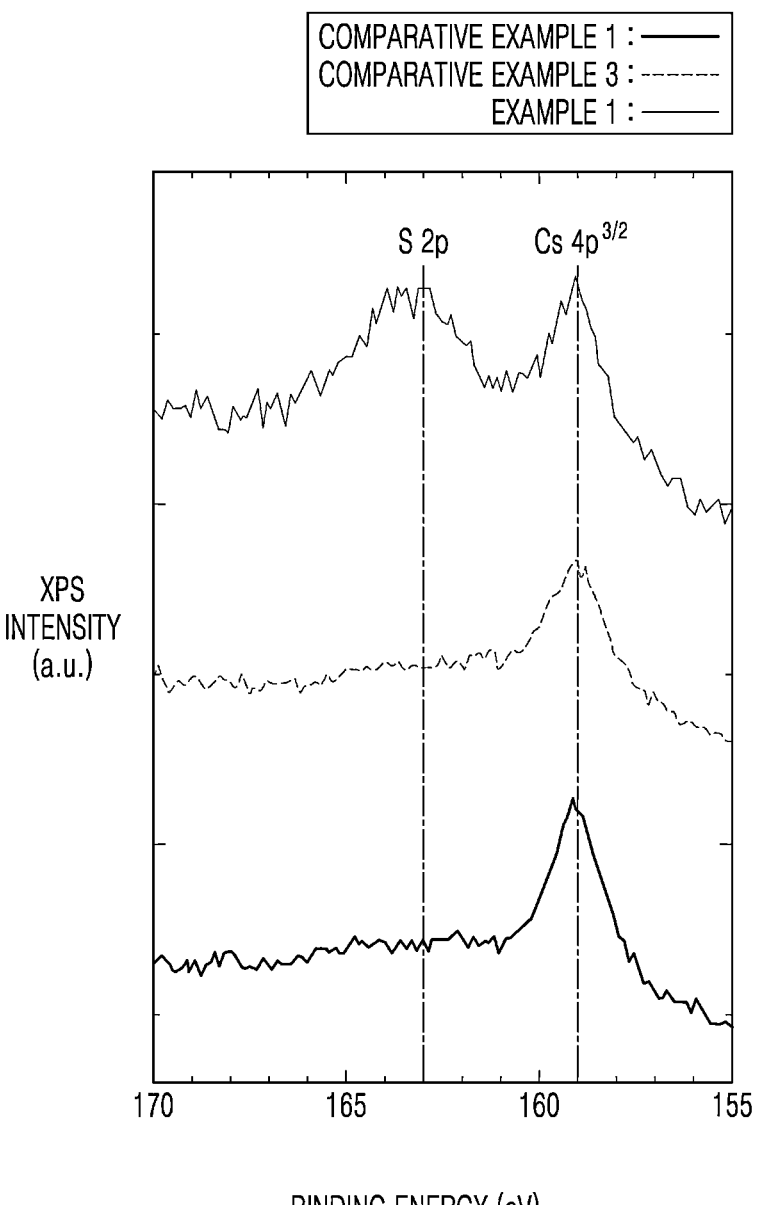
FIG. 7 is a graph of XPS intensity (a.u.) versus binding energy (electron volts, eV), showing X-ray photoelectron (XPS) spectra of the light-emitting materials according to Example 1, Comparative Example 1, and Comparative Example 3.

When the heat-treatment temperature was 120° C., XPS spectra of the light-emitting materials according to Example 1, Comparative Example 1, and Comparative Example 3 were measured, and results thereof are shown in FIG. 7.

Referring to FIG. 7, it can be seen that in Example 1, a sulfur (S) peak was formed as compared to Comparative Example 1 according to $Pb(SCN)_2$ treatment.

Evaluation Example 5: XRD Spectrum Measurement

Figure 8:
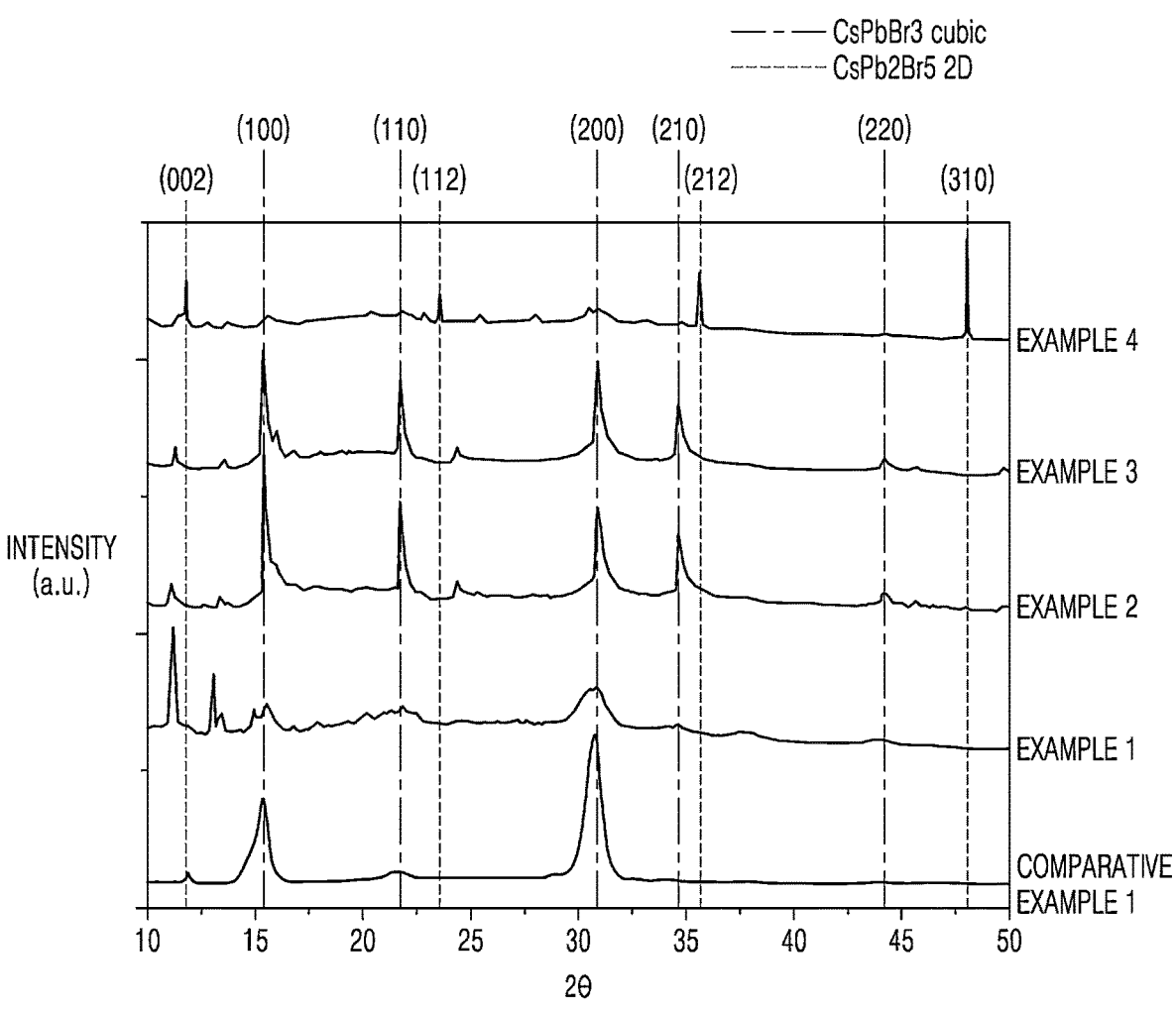
FIG. 8 is a graph of XRD intensity (a.u.) versus diffraction angle (degrees 2-theta, degrees 2θ), showing a diagram showing the results of X-ray diffractometry (XRD) analysis of the light-emitting materials according to Comparative Example 1 and Examples 1 to 4.

The XRD spectra of the light-emitting materials according to Comparative Example 1 and Example 1 to Example 4 were measured, and results thereof are shown in FIG. 8.

Referring to FIG. 8, it can be seen that in the case of Examples 1 to 3, the cubic peak was sharpened according to the $Pb(SCN)_2$ treatment, and in Example 4, a platelet type 2D peak is generated.

The light-emitting material has improved thermal stability and moisture stability, so that luminescence efficiency is not significantly reduced by heat treatment. In addition, when the concentration of $Pb(SCN)_2$ was increased, the photoluminescence quantum yield (PLQY) may be improved as the heat treatment is performed at a high temperature.

A light-emitting device including the light-emitting material may have improved lifespan and/or efficiency.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting material, comprising:
a quantum dot represented by Formula 1; and
$Pb(SCN)_2$,
wherein a surface of the quantum dot is passivated by the $Pb(SCN)_2$, and
wherein the light-emitting material has a stretching vibrational peak corresponding to a carbon-nitrogen triple bond in a range of about 2000 inverse centimeter to about 2100 inverse centimeter, when measured by infrared (IR) spectroscopy:

$$A^1B^1X^1_3 \qquad \text{Formula 1}$$

wherein, in Formula 1,
$A^1$ is at least one of a monovalent organic cation or a monovalent inorganic cation,
$B^1$ is Sn or Pb, and
$X^1$ is at least one halogen,
wherein the light-emitting material has diffraction peaks corresponding to at least four crystal planes that are a (002) crystal plane, a (100) crystal plane, a (110) crystal plane, a (112) crystal plane, a (200) crystal plane, a (210) crystal plane, a (212) crystal plane, a (220) crystal plane, or a (310) crystal plane, when determined by X-ray diffraction (XRD) analysis.

2. The light-emitting material of claim 1, wherein the quantum dot is represented by Formula 1-A:

$$A^1PbX^1_3 \qquad \text{Formula 1-A}$$

wherein, in Formula 1-A,
$A^1$ is at least one of a monovalent organic cation or a monovalent inorganic cation, and
$X^1$ is at least one halogen.

3. The light-emitting material of claim 1, wherein
$A^1$ is $Cs^+$, and
$X^1$ is $Cl^-$, $Br^-$, $I^-$ or a combination thereof.

4. The light-emitting material of claim 1,
wherein the quantum dot represented by Formula 1 comprises $CsPbBr_3$, $CsPbBr_xCl_{(3-x)}$ wherein x is a real number greater than 0 and less than or equal to 3, $CsPbCl_3$, or a combination thereof.

5. The light-emitting material of claim 1,
wherein the light-emitting material comprises about 0.1 millimoles to about 2 millimoles of $Pb(SCN)_2$ per 1 millimole of the quantum dot.

6. The light-emitting material of claim 1,
wherein the light-emitting material has an absorption peak in a range of about 360 nanometers to about 410 nanometers, when measured by ultraviolet-visible (UV-Vis) absorption spectroscopy.

7. The light-emitting material of claim 1,
wherein the light-emitting material has an S 2p peak at a binding energy of about 160 electron volts to about 165 electron volts, when measured by X-ray photoelectron spectroscopy (XPS).

8. A light-emitting device, comprising:
a first electrode;
a second electrode facing the first electrode; and
an emission layer located between the first electrode and the second electrode,
wherein the emission layer comprises the light-emitting material of claim 1.

9. The light-emitting device of claim 8, further comprising:
a hole transport region located between the first electrode and the emission layer,
an electron transport region located between the emission layer and the second electrode, or
both a hole transport region located between the first electrode and the emission layer, and an electron transport region located between the emission layer and the second electrode.

10. A method of preparing a light-emitting material, the method comprising:
disposing a mixture comprising a quantum dot, $Pb(SCN)_2$, and a solvent onto a substrate, wherein the quantum dot is represented by Formula 1; and
heating the substrate to remove the solvent and form the light-emitting material,
wherein a surface of the quantum dot is passivated by the $Pb(SCN)_2$:

$$A^1B^1X^1_3 \qquad \text{Formula 1}$$

wherein, in Formula 1,
$A^1$ is at least one of a monovalent organic cation or a monovalent inorganic cation,
$B^1$ is Sn or Pb, and $X^1$ is at least one halogen,
wherein the light-emitting material has diffraction peaks corresponding to at least four crystal planes that are a (002) crystal plane, a (100) crystal plane, a (110) crystal plane, a (112) crystal plane, a (200) crystal plane, a (210) crystal plane, a (212) crystal plane, a (220) crystal plane, or a (310) crystal plane, when determined by X-ray diffraction (XRD) analysis.

11. The method of claim 10,
wherein the mixture comprises about 0.1 millimoles to about 2 millimoles of $Pb(SCN)_2$ per 1 millimole of the quantum dot.

12. The method of claim 10,
wherein the heating of the substrate is performed at 30° C. or higher.

13. The method of claim 10,
wherein the solvent is toluene, hexane, benzene, pentane or a combination thereof.

14. The method of claim 10, further comprising, before the step of disposing the mixture, the steps of:
forming a first mixed solution by mixing a first precursor solution and a second precursor solution, wherein the first precursor solution comprises a first precursor and a first solvent, and wherein the second precursor solution comprises a second precursor and a second solvent;
forming a precipitate by mixing the first mixed solution with a third precursor solution, wherein the third precursor solution comprises a third precursor and a third solvent;
separating the precipitate; and
dispersing the precipitate in a fourth solvent.

15. The method of claim 14,
wherein the precipitate that is dispersed in the fourth solvent comprises a halogen-rich quantum dot; and
wherein the first mixed solution comprises a halogen-deficient quantum dot.

16. The method of claim 14, wherein
the first precursor is a salt of an ammonium cation, an alkylammonium cation, an arylammonium cation, an arylalkylammonium cation, a formamidinium cation, an alkylamidinium cation, an arylamidinium cation, an arylalkylamidinium cation, or an alkali metal cation, and
the second precursor and the third precursor are each independently a salt of a halogen.

17. The method of claim 14,
wherein the first solvent, the second solvent, and the third solvent are each independently 1-octadecene (ODE), oleic acid (OA), oleylamine (OLA), or a combination thereof.

18. The method of claim 14,
wherein the fourth solvent is diethyl ether, toluene, α-terpineol, hexyl carbitol, ethyl acetate, butyl carbitol acetate, hexyl cellosolve, butyl cellosolve acetate, or a combination thereof.

19. The method of claim 14, further comprising adding a first compound to the precipitate dispersed in the fourth solvent before the step of disposing the mixture.

* * * * *